United States Patent [19]

Hong et al.

[11] Patent Number: 4,638,256

[45] Date of Patent: Jan. 20, 1987

[54] EDGE TRIGGERED CLOCK DISTRIBUTION SYSTEM

[75] Inventors: Vuong B. Hong, Laguna Hills; Stuart C. Rowson; Richard A. Daniel, both of Escondido; Paul M. Rostek, San Diego, all of Calif.

[73] Assignee: NCR Corporation, Dayton, Ohio

[21] Appl. No.: 765,770

[22] Filed: Aug. 15, 1985

[51] Int. Cl.[4] ............................................. H03K 5/15
[52] U.S. Cl. ..................................... 328/105; 328/55; 328/62; 307/269
[58] Field of Search ................. 377/76; 328/103, 105, 328/55, 62; 307/269

[56] References Cited

U.S. PATENT DOCUMENTS

| | | | |
|---|---|---|---|
| 3,248,657 | 4/1966 | Turecki | 328/55 |
| 3,386,080 | 5/1968 | Brym | 328/105 |
| 3,502,991 | 3/1970 | Sampson | 328/105 |
| 3,921,079 | 11/1975 | Heffner et al. | 328/62 |
| 4,337,433 | 6/1982 | Yoshimura | 328/55 |

Primary Examiner—John S. Heyman
Attorney, Agent, or Firm—Wilbert Hawk, Jr.; Edward Dugas; Floyd A. Gonzalez

[57] ABSTRACT

A clock distribution system having a generator for generating a train of pulses, a transition circuit connected to the output of the generator for generating a clock signal having spaced apart transitions of a desired polarity, a distribution circuit distributing the clock signal to a plurality of boards which utilize the clock signal, and a flip-flop on each of the boards which utilize the clock signal. Each of the flip-flops is connected to the distribution circuit for receiving the clock signal and for generating clock pulses which are defined by the spaced apart transitions.

7 Claims, 12 Drawing Figures

EDGE TRIGGERED CLOCK DISTRIBUTION SYSTEM

BACKGROUND OF THE INVENTION

The present invention is related to a clock circuit for use in a general purpose digital computer, and is more particularly related to a clock distribution system for distributing a clock signal to a plurality of circuit boards of a digital computer.

Because of the sizes of circuits and cabinets generally used for a general purpose digital computer, it is many times desirable to utilize several circuit boards to support the complete system. Clock distribution systems are known for distributing clock pulses to the circuit boards to synchronize the components of the digital computer. Because of the difference of the times of propagation of the various elements of a clock distribution system for high-to-low and low-to-high transitions, the pulse widths of a clock signal are distorted by each element through which the clock signal passes. When a logic tree of many stages of transistor-to-transistor logic (TTL) devices is used for a clock distribution system, the distortion and skew of clock pulses is such that the clock pulses are not usable for a digital computer system, expecially for very large scale integrated (VLSI) circuit chips.

U.S. Pat. No. 3,739,199 issued June 12, 1973 to Negrou for "Generator Of A Time Interval As A Multiple Of A Base Period" discloses a device having a standard time interval of a well-defined duration delimited by two fronts separated by N periods of an oscillation.

U.S. Pat. No. 3,921,079 issued Nov. 18, 1975 to Heffner et al. for "Multi-Phase Clock Distribution System" discloses a multi-phase clock distribution system utilizing a phase shift adjustment circuit in each phase clock chain preceeding a phase output countdown circuitry thereby providing phase adjustability which is inherently free from period, pulse width or edge distortion and produces clock signals with precisely determined leading and trailing edges.

Other patents which show the state of the art include: U.S. Pat. No. 3,124,705 issued Mar. 10, 1964 to Gray, Jr. for "Synchronized Single Pulse Circuit Producing Output of Predetermined Length From Delay Lines Having Dissimilar Periods"; U.S. Pat. No. 3,675,049 issued July 4, 1972 to Haven for "Variable Digital Delay Using Multiple Parallel Channels And A Signal-Driven Bit Distributor"; U.S. Pat. No. 4,063,109 issued Dec. 13, 1977 to van der Mark for "Clock Pulse System"; U.S. Pat. No. 4,253,065 issued Feb. 24, 1981 to Wyman et al. for "Clock Distribution System For Digital Computers"; U.S. Pat. No. 4,481,575 issued Nov. 6, 1984 to Bazlen et al. for "Arrangement In A Data Processing System To Reduce The Cycle Time"; and U.S. Pat. No. 4,490,821 issued Dec. 25, 1984 to Lacher for "Centralized Clock Time Error Correction System."

SUMMARY OF THE INVENTION

In a specific embodiment, a clock distribution system is disclosed having a generator for generating a train of pulses, a transition circuit connected to the output of the generator for generating a clock signal having spaced apart transitions of a desired polarity, a distribution circuit for distributing the clock signal to a plurality of boards which utilize the clock signal, and a flip-flop on each of the boards which utilize the clock signal. Each of the flip-flops is connected to the distribution circuit for receiving the clock signal and for generating clock pulses which are defined by the spaced apart transitions.

It is an object of the present invention to provide a clock distribution circuit in which a clock pulse is defined by negative going edges of the clock signal to prevent skew and other distortion from affecting the clock signal.

It is another object of the present invention to provide a clock distribution circuit having a delay line for controlling the width of the clock pulse, and a delay line for controlling the time between clock pulses.

It is another object of the present invention to provide reset signals after each clock pulse, and a flip-flop which is reset by the reset signal to insure that the clock pulse will have the right shape and remain in a desired phase after power up or a noise transient.

These and other objects of the present invention will become apparent from the drawings and the preferred embodiment disclosed herein.

DESCRIPTION OF THE PREFERRED EMBODIMENT

Figure 1:
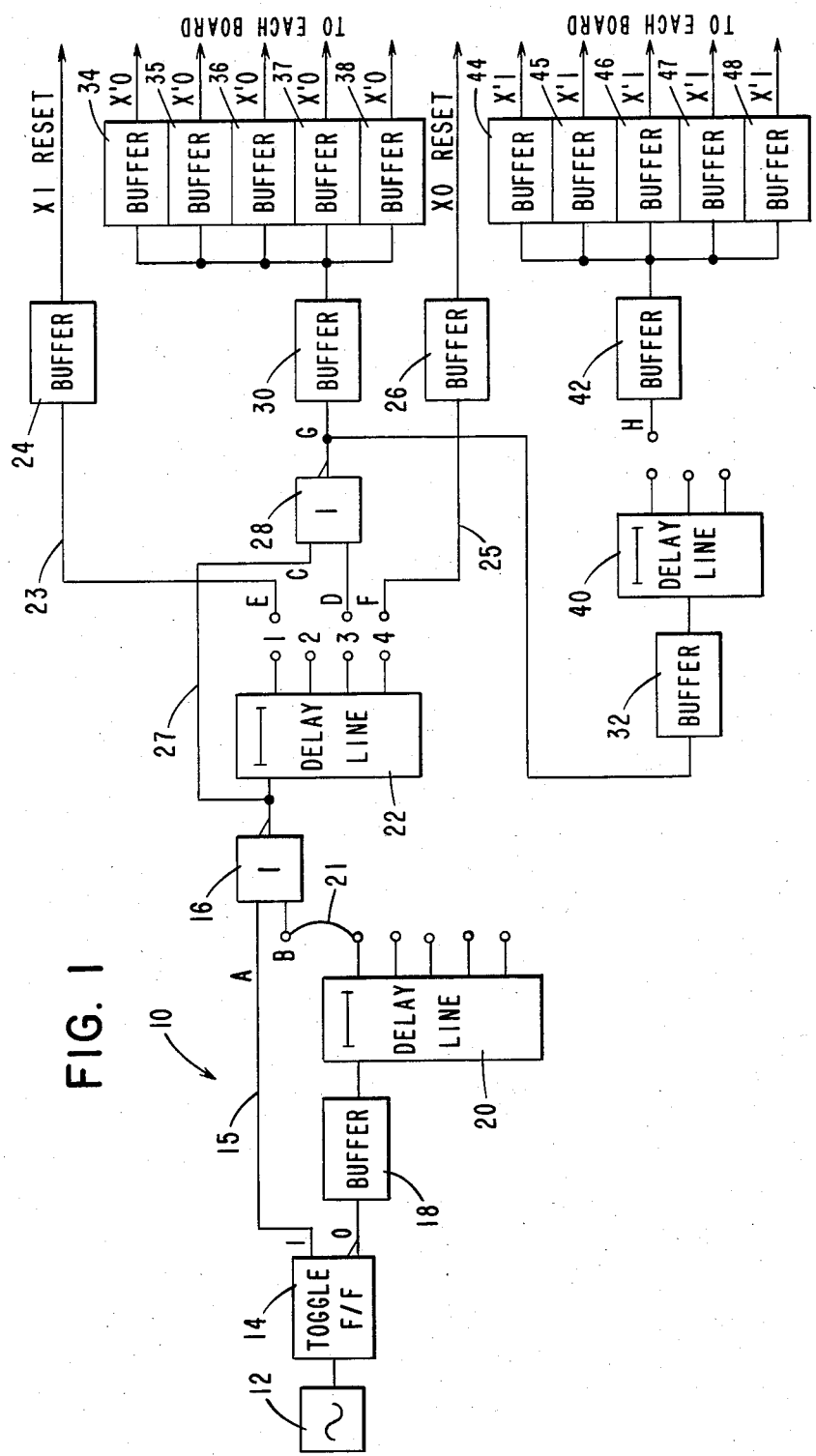
FIG. 1 is a block diagram of a portion of a clock distribution circuit resident on a main clock board.

FIG. 1 is a block diagram of the central clock timing circuit of the clock distribution system of the present invention. The central clock timing circuit 10, on a main clock board, includes a crystal oscillator 12 whose output is connected to the clock input of a toggle flip-flop 14. The "1" output of the toggle flip-flop 14 is connected by conductor 15 to one input of a NOR gate 16. The "0" output of the toggle flip-flop 14 is connected to a buffer 18, whose output is connected to the input of a delay line 20. A selected output of the delay line 20 is connected to a second input of the NOR gate 16 such as by jumper 21. The output of the NOR gate 16 is connected to the input of a second delay line 22.

A selected output of the delay line 22 is connected by conductor 23 to a buffer 24 which provides an X1 reset signal, to be discussed. A second output of the delay line 22 is connected by conductor 25 to a buffer 26, which provides an X0 reset signal, to be discussed. A third output of the delay line 22 is connected to one of the inputs of a NOR gate 28. The other input of the NOR gate 28 is connected to the output of the NOR gate 16 such as by conductor 27, or may, if desired, be connected to a fourth output of the delay line 22.

The output of NOR gate 28 is connected to a pair of buffers 30 and 32. The output of buffer 30 is connected to a plurality of buffers 34–38, each of which outputs a clock signal X'0. Each of the clock signals X'0 is outputted for use by a different board in the clock distribution system. The output of buffer 32 is connected to a third delay line 40. A selected output of the delay line 40 is connected to a buffer 42 whose output is connected to a plurality of buffers 44–48. Each of the buffers 44–48 outputs a clock signal X'1 for use by the boards previously described.

Figure 2:
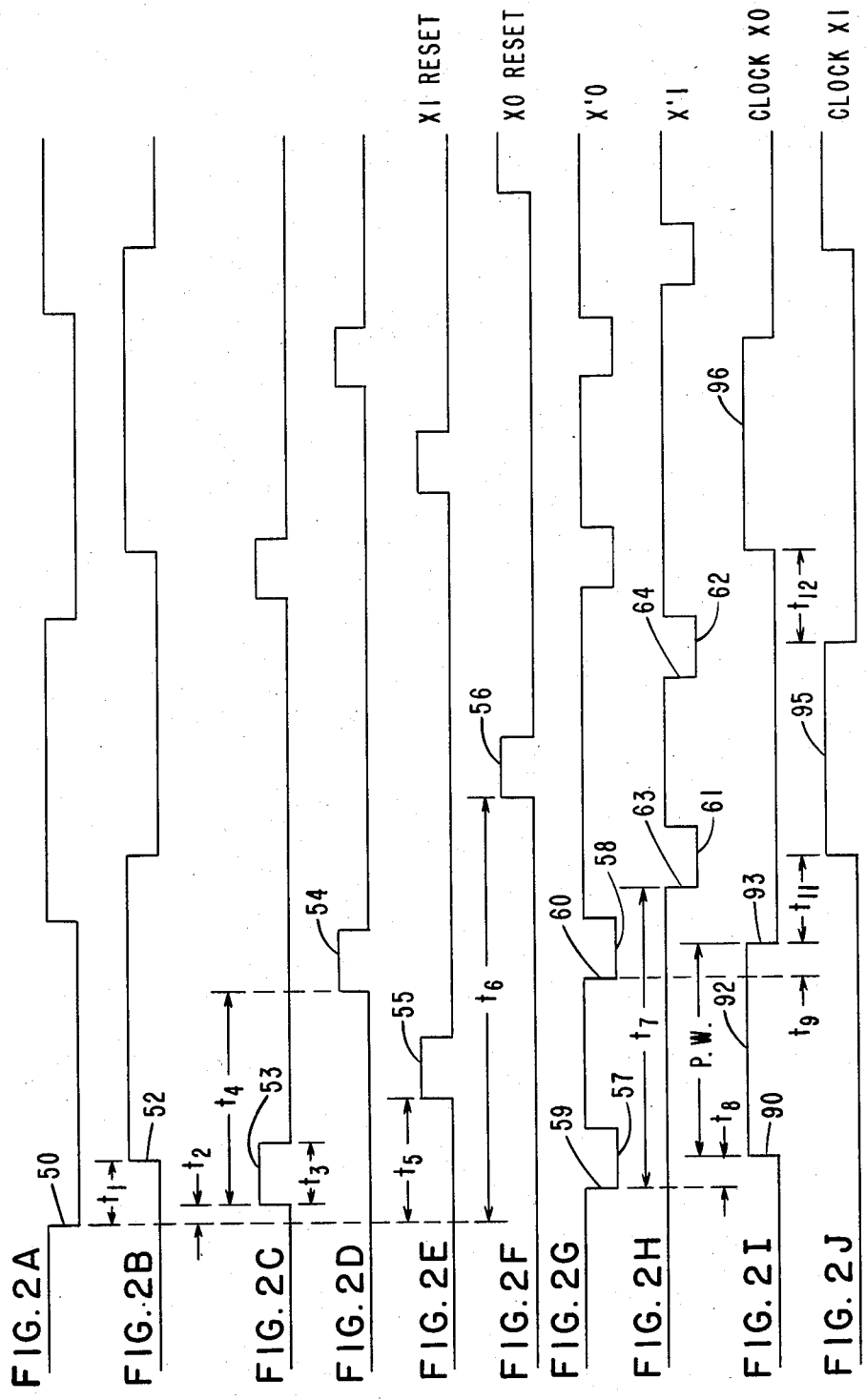
FIG. 2A-2J, when taken together, provides a timing diagram of various signal waveforms of the clock distribution circuit.

FIGS. 2A-2H, taken together, present a timing diagram of signals at various points in the circuit of FIG. 1. The letter designation with each of the waveforms of FIGS. 2A-2H is the same as the letter designation at various points in FIG. 1. For instance, FIG. 2A corresponds to the waveform at point A on conductor 15 of FIG. 1. The waveform shown in FIG. 2A is the output for the "1" terminal of the toggle flip-flop 14, which is toggled by each pulse from the crystal oscillator 12. FIG. 2B shows the buffered, delayed signal output from the "0" output of toggle flip-flop 14. The time delay t1 between the negative going edge 50 of the waveform of FIG. 2A and the positive going edge 52 of the waveform of FIG. 2B is caused by the delay line 20, and is preferably in the order of 13 nanoseconds. The waveform 2C includes a pulse 53 which is delayed by the time t2 by a selected output of the delay line 22. The delay t2 of FIG. 2C is preferably as small as possible. This may be done, as previously discussed, by connecting point C, which is one input of NOR gate 28, directly to the output of NOR gate 16 by conductor 27 (see FIG. 1). The width t3 of the pulse 53 is equal to the time delay t1 caused by the delay line 20, as previously described. FIG. 2D includes a pulse 54 similar to the pulse 53 described in connection with FIG. 2C, but which has been delayed by a time t4 by the delay line 22, preferably 45 nanoseconds. FIG. 2E includes a reset pulse 55 which has been delayed by a time t5 by the delay line 22. The pulse 55 is used as an X1 clock reset (X1 RESET) by the boards utilizing the clock signals, to be described. FIG. 2F includes a pulse 56 which is delayed by time t6 by the delay line 22. The pulse 56 is used as a reset pulse for resetting the X0 clock signals (X0 RESET) utilized by the mentioned boards, also to be further described.

FIG. 2G shows the output of NOR gate 28 in which the pulses 53 and 54 are combined into a signal including pulses 57 and 58, whose negative going edges 59 and 60 respectively, define the start and stop of the clock pulses X'0. FIG. 2H shows starting and stopping pulses 61 and 62 for the X'1 clock signals, which have been delayed by the time t7 by the delay line 40. The time t7 is preferably 75 nanoseconds.

Figure 3:
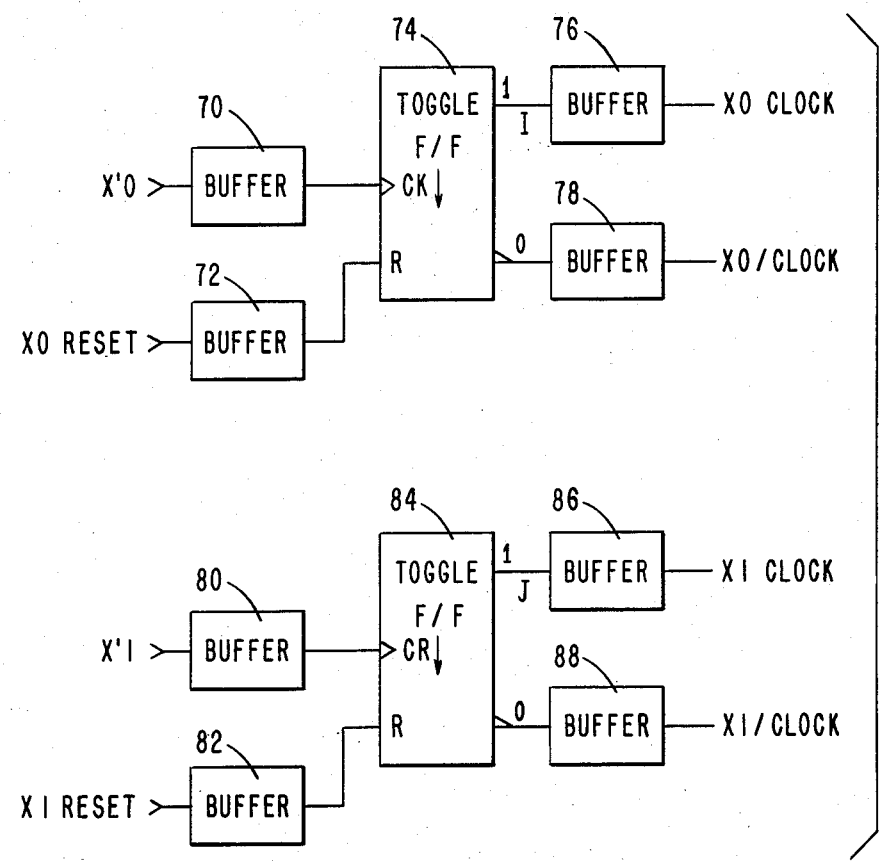
FIG. 3 is a block diagram of a portion of the clock distribution circuit resident on each board which utilizes the clock signals of the clock distribution circuit.

FIG. 3 is a block diagram of a circuit on each of the boards using the clock signals from the central clock timing circuit of FIG. 1, wherein the clock pulses are reformed for use by board circuitry. The reforming circuit of FIG. 3 includes a buffer 70 for receiving the X'0 signal from one of the buffers 34-38 of FIG. 1, and a buffer 72 for receiving the X0 RESET signal from buffer 26 of FIG. 1. The output of buffer 70 is inputted into the clock terminal of a toggle flip-flop 74, and the output of buffer 72 is inputted into the reset terminal of the toggle flip-flop 74. The "1" output of the flip-flop 74 is connected to a buffer 76, whose output provides the X0 clock signal for use by the board elements (not shown). The "0" output of toggle flip-flop 76 is connected to a buffer 78, whose output provides the X0/ clock signal. A buffer 80 receives the X'1 signal from one of the buffers 44-48 of FIG. 1, and a buffer 82 receives the X1 RESET signal from buffer 24 of FIG. 1. The output of buffer 80 is inputted into the clock input of a toggle flip-flop 84, and the output of buffer 82 is inputted into the reset input of the toggle flip-flop 84. A buffer 86 is connected to the "1" output of the toggle flip-flop 84 for providing the X1 clock signal to elements of the board, and a buffer 88 is connected to the "0" output of the toggle flip-flop 84 for providing the X1/ clock signal. The waveform at I of FIG. 3, is shown in FIG. 2I, and the waveform at J is shown in FIG. 2J. It will be understood that the negative going edge 59 of the pulse 57 of FIG. 2G will toggle the flip-flop 74, to start the leading edge 90 of the X0 clock pulse 92, while the negative going edge 60 of the pulse 58 of FIG. 2G will end the X0 clock pulse 92 of FIG. 2I at negative going edge 93. The delay t8 shown between the edge 59 of the pulse 57 of FIG. 2G and the edge 90 of the pulse 92 of FIG. 2I, and the delay t9 shown between the edge 60 of pulse 58 of FIG. 2G and the edge 92 of the pulse 86 of FIG. 2I are caused by time delays inherent in the several buffer circuits and lines through which the signals must pass from the main clock board of FIG. 1 to the board of FIG. 3 which utilizes the clock pulses.

The edges 63 and 64 of pulses 61 and 62, respectively of FIG. 2H are utilized by the toggle flip-flop 84 of FIG. 3 to form the X1 clock pulse 95 of FIG. 2J, similar to the forming of the X0 clock pulse 92 discussed in connection with FIG. 2I.

The time delays $t_1$, $t_3$, and $t_4$ are adjusted by appropriate selection of delay lines 20 and 22, and the outputs therefrom, to set the duty cycle of the clock signals X0 and X1, pulses 92 and 95 respectively, and determine the pulse width (P.W. of FIG. 2I) of the clock pulses. The time delay $t_7$ provided by delay line 40, is selected such that the times t11 and t12 are equal, thereby correctly spacing the X0 and X1 signals in relationship to one another. The X1 RESET signal of FIG. 2E is inputted to the reset terminal of the toggle flip-flop 74 of FIG. 3, and the X0 RESET signal of FIG. 2F is inputted into the reset terminal of the toggle flip-flop 84 to insure that the flip-flop's outputs remain in phase with each other. As can be seen in FIG. 2F, the X0 RESET pulse 56 is positioned between the end of one X0 pulse 92 and the beginning of a succeeding X0 pulse 96 to insure that at power up or after a noise transient at X0, X1 will still have its correct shape and will remain in phase. The X1 RESET pulse 55 is similarly utilized to reset the toggle flip-flop 84 of FIG. 3 so that it is in the correct state to properly form the X1 clock signal pulse 95 of FIG. 2J.

Thus, a clock distribution system has been described which provides the aforementioned objects. It will be understood by those skilled in the art that the disclosed embodiment is exemplary only, and that various elements disclosed may be replaced by equivalents without departing from the invention hereof, which equivalents are intended to be covered by the appended claims.

What is claimed is:
1. A clock distribution system comprising:
  a generator for generating a train of pulses;
  transition means connected to the output of said generator for generating a clock signal having spaced apart transitions of a desired polarity;
  distribution means distributing said clock signal to a plurality of boards which utilize aaid clock signal;
  flip-flop means on each of the boards which utilize said clock signal, each of said flip-flop means being connected to said distribution means for receiving said clock signal and for generating clock pulses defined by said spaced apart transitions;
  reset pulse generating means connected to said generator means for generating reset pulses after every second transition of a desired polarity;

reset means in said flip-flop means for receiving said reset pulses and for resetting said flip-flop means to a desired state after every one of said clock pulses;

alternate clock signal means in said transition means for additionally generating an alternate clock signal having two alternate transitions of a desired polarity after every second transitions of said clock signal;

alternate flip-flop means in said flip-flop means for receiving said alternate clock signal and for generating alternate clock pulses each defined by said two alternate transitions;

alternate reset pulse generating means connected to said generator means for generating alternate reset pulses after every second one of said alternate transitions;

alternate reset means in said alternate flip-flop means for receiving said alternate reset pulses and for resetting said alternate flip-flop means to a desired state after every one of said alternate clock pulses;

first delay line means in said transition means for delaying the alternate clock signal so as to time the alternate clock pulses of said alternate flip-flop means centrally between adjacent ones of said clock pulses.

2. The clock distribution system of claim 1 wherein said transition means comprises a second delay line connected to the output of said generator for controlling the time between adjacent transitions of a desired polarity for determining the pulse width of the clock pulses of each of said flip-flop means.

3. The clock distribution system of claim 1 wherein said transition means includes means for determining the desired polarity of said transitions to be negative going transitions.

4. A clock distribution system comprising:
a generator;
a first flip-flop having two outputs and connected to said generator;
a first NOR gate having two inputs, one input connected to one output of said first flip-flop;
a first delay line connected to the other output of said first flip-flop;
a selected output of said first delay line connected to the other input of said first NOR gate for generating a train of pulses of a desired width;
a second delay line connected to the output of said first NOR gate;
a second NOR gate having two inputs and an output, one of said second NOR gate inputs being connected to the output of said first NOR gate, and the other of said second NOR gate inputs connected to a selected output of said second delay line for generating a train of pairs of pulses on said output;
distribution means connected to the output of said second NOR gate for distributing said pairs of pulses to a plurality of circuit boards; and
a second flip-flop on each of the circuit boards having an input connected to said distribution means for receiving said pairs of pulses, each of said second flip-flops changing its state upon selected edges of said pairs of pulses thereby generating clock pulses defined by said edges.

5. The clock distribution system of claim 4 wherein said second delay line has additional delay means for delaying the pulses outputted by said first NOR gate for a set time after each pair of said pairs of pulses outputted by said second NOR gate thereby generating a reset signal;
said additional delay means connected to said distribution means; and
each of said second flip-flops having reset means connected to said distribution means for receiving said reset signal for resetting said second flip-flops after each generation of said clock pulses.

6. The clock distribution system of claim 5 further comprising a third delay line connected between the output of said second NOR gate and said distribution means for delaying said pairs of pulses to generate an alternate train of pairs of pulses; and
a third flip-flop on each circuit board, each having an input connected to said distribution means for receiving said alternate pairs of pulses, each of said third flip-flops changing its state upon selected edges of said alternate pairs of pulses thereby generating alternate clock pulses defined by the edges of said alternate pairs of pulses.

7. The clock distribution of claim 6 wherein said second delay line includes further delay means to further delay the pulses outputted by said first NOR gate for a set time after said alternate pairs of pulses are outputted by said third delay line thereby generating an alternate reset signal;
said further delay means connected to said distribution means; and
each of said third flip-flops having reset means connected to said distribution means for receiving said alternate reset signal for resetting said third flip-flops after each generation of said alternate clock pulses.

* * * * *